US009182667B2

(12) United States Patent
Moon et al.

(10) Patent No.: US 9,182,667 B2
(45) Date of Patent: Nov. 10, 2015

(54) PHOTOSENSITIVE RESIN COMPOSITION FOR COLOR FILTER AND COLOR FILTER USING THE SAME

(75) Inventors: Kyung-Soo Moon, Uiwang-si (KR); Seung-Hyun Kim, Uiwang-si (KR); Jae-Hyun Kim, Uiwang-si (KR); Myoung-Youp Shin, Uiwang-si (KR); Dong-Hoon Won, Uiwang-si (KR); Hwan-Sung Cheon, Uiwang-si (KR)

(73) Assignee: Cheil Industries Inc., Gum-si (KR)

( * ) Notice: Subject to any disclaimer, the term of this patent is extended or adjusted under 35 U.S.C. 154(b) by 0 days.

(21) Appl. No.: 14/353,356

(22) PCT Filed: May 17, 2012

(86) PCT No.: PCT/KR2012/003891
§ 371 (c)(1),
(2), (4) Date: Jul. 3, 2014

(87) PCT Pub. No.: WO2013/094827
PCT Pub. Date: Jun. 27, 2013

(65) Prior Publication Data
US 2014/0349220 A1    Nov. 27, 2014

(30) Foreign Application Priority Data
Dec. 22, 2011 (KR) .................. 10-2011-0140582

(51) Int. Cl.
| | |
|---|---|
| G02B 5/20 | (2006.01) |
| G03F 7/004 | (2006.01) |
| G03F 7/031 | (2006.01) |
| G03F 7/00 | (2006.01) |
| G03F 7/033 | (2006.01) |
| G03F 7/105 | (2006.01) |
| G02B 5/22 | (2006.01) |

(52) U.S. Cl.
CPC .............. *G03F 7/031* (2013.01); *G03F 7/0007* (2013.01); *G03F 7/033* (2013.01); *G03F 7/105* (2013.01); *G02B 5/201* (2013.01); *G02B 5/223* (2013.01)

(58) Field of Classification Search
CPC ........ G03F 7/0007; G03F 7/031; G02B 5/223
USPC .................................... 430/7, 270.1
See application file for complete search history.

(56) References Cited

U.S. PATENT DOCUMENTS

| | | | |
|---|---|---|---|
| 4,942,141 A | 7/1990 | DeBoer et al. | |
| 5,346,545 A | 9/1994 | Chassot | |
| 5,998,091 A | 12/1999 | Suzuki | |
| 6,033,813 A | 3/2000 | Engo et al. | |
| 6,544,702 B1 | 4/2003 | Haggquist et al. | |
| 6,733,935 B2 | 5/2004 | Kishimoto et al. | |
| 7,517,619 B2 | 4/2009 | Hosaka et al. | |
| 8,110,324 B2 | 2/2012 | Fujimori et al. | |
| 8,361,681 B2 | 1/2013 | Makino et al. | |
| 2011/0250531 A1 | 10/2011 | Kwon et al. | |
| 2013/0137018 A1* | 5/2013 | Arayama et al. ................. | 430/7 |

FOREIGN PATENT DOCUMENTS

| | | |
|---|---|---|
| CN | 1334932 A | 2/2002 |
| EP | 2105792 A1 | 9/2009 |
| JP | 06-019168 A | 1/1994 |
| JP | 06-041458 A | 2/1994 |
| JP | 06-093257 A | 4/1994 |
| JP | 07-140654 A | 6/1995 |
| JP | 10-254133 A | 9/1998 |
| JP | 2001-342364 A | 12/2001 |
| JP | 2009-242469 A | 10/2009 |
| KR | 10-1999-0007097 A | 1/1999 |
| KR | 10-2002-0015650 A | 2/2002 |
| KR | 10-2005-0016667 A | 2/2005 |
| KR | 10-2005-0020653 A | 3/2005 |
| KR | 10-2009-0073932 A | 7/2009 |
| KR | 10-2009-0106226 A | 10/2009 |
| KR | 10-2010-0078845 A | 7/2010 |
| KR | 10-2010-0080142 A | 7/2010 |
| KR | 10-2011-0079198 A | 7/2011 |
| KR | 10-2011-0112696 A | 10/2011 |
| TW | 201135360 A1 | 10/2011 |
| WO | WO 2012/011391 A1 * | 1/2012 |
| WO | 2013/094827 A1 | 6/2013 |

OTHER PUBLICATIONS

Search Report in counterpart Taiwanese Application No. 101118728 dated Mar. 14, 2014, pp. 1.

English-translation of Search Report in counterpart Taiwanese Application No. 101118728 dated Mar. 14, 2014, pp. 1.

Bello et al., "Near-infrared-absorbing Squaraine Dyes containing 2,3-Dihydroperimidine Terminal Groups", J. Chem. Soc., Chem. Commun., 1993, pp. 452-454.

International Search Report and Written Opinion in counterpart International Application No. PCT/KR2012/003891 dated Nov. 30, 2012, pp. 1-6.

* cited by examiner

*Primary Examiner* — John A McPherson

(74) *Attorney, Agent, or Firm* — Additon, Higgins & Pendleton, P.A.

(57) ABSTRACT

Disclosed are a photosensitive resin composition for a color filter that includes (A) a squaraine dye including at least one selected from compounds represented by the following Chemical Formulae 1 and 2, (B) an alkali soluble resin, (C) a photopolymerizable monomer, (D) a photopolymerization initiator, and (E) a solvent, and a color filter using the same.

5 Claims, No Drawings

PHOTOSENSITIVE RESIN COMPOSITION FOR COLOR FILTER AND COLOR FILTER USING THE SAME

CROSS-REFERENCE TO RELATED APPLICATIONS

This application claims priority to and the benefit of International Application No. PCT/KR2012/003891, filed May 17, 2012, which published as WO 2013/094827 on Jun. 27, 2013, and Korean Patent Application No. 10-2011-0140582, filed in the Korean Intellectual Property Office on Dec. 22, 2011, the entire disclosure of each of which is incorporated herein by reference.

TECHNICAL FIELD

This disclosure relates to a photosensitive resin composition for a color filter and a color filter using the same.

BACKGROUND ART

A liquid crystal display device is one of display devices and has advantages of lightness, thinness, low cost, low power consumption, an excellent junction with an integrated circuit, and the like, and thus is widely applied for a laptop, a monitor, and a TV screen. The liquid crystal display device includes a lower substrate including a black matrix, a color filter, and an indium tin oxide (ITO) pixel electrode, and an upper substrate including an active circuit portion including a liquid crystal layer, a thin film transistor, an electricity storage capacitor layer, and an ITO pixel electrode. In the liquid crystal display device, color filters are formed in a pixel region by sequentially laminating a plurality of color filters (in general, formed of three primary colors such as red (R), green (G), and blue (B)) in a predetermined order to form each pixel, and a black matrix layer is disposed in a predetermined pattern on a transparent substrate to form a boundary between the pixels.

A color filter may be fabricated in a pigment dispersion method. According to the pigment dispersion method, a coloring thin film is formed by repeatedly coating a photopolymerizable composition including a colorant on a transparent substrate provided with a black matrix, exposing a desired pattern to a light, removing an unexposed part with a solvent, and thermally curing the resulting product. The photosensitive resin composition for a color filter used in the pigment dispersion method generally includes an alkali soluble resin, a photopolymerizable monomer, a photopolymerization initiator, an epoxy resin, a solvent, other additives, and the like. The pigment dispersion method has been actively applied to an LCD of a mobile phone, a laptop, a monitor, TV, and the like. However, a photosensitive resin composition for a color filter for the pigment dispersion method has recently required more improved performance as well as excellent pattern characteristics. Particularly, high luminance and high contrast ratio along with high color reproducibility are required.

An image sensor is a part for photographing images in a portable phone camera or a DSC (digital still camera). It can be classified as a charge-coupled device (CCD) image sensor and a complementary metal oxide semiconductor (CMOS) image sensor depending upon the manufacturing process and the application method. A color imaging device for a charge-coupled device (CCD) image sensor or a complementary metal oxide semiconductor (CMOS) image sensor includes color filters each having filter segments of mixing primary color of red, green, and blue, and the colors are separated. A recent color filter mounted in the color imaging device has a pattern size of 2 μm or less, which is 1/100th to 1/200th of the pattern size of a conventional color filter pattern for LCDs. Accordingly, increased resolution and decreased pattern residues are important factors for determining the performance of a device.

A color filter fabricated by using a conventional pigment-type photosensitive resin composition has a limit in luminance and a contrast ratio due to the size of pigment particles. In addition, a color imaging device for an image sensor needs a smaller dispersion particle diameter for forming a fine pattern.

DISCLOSURE

Technical Problem

One embodiment provides a photosensitive resin composition for a color filter having high luminance and contrast ratio.

Another embodiment provides a color filter manufactured using the photosensitive resin composition for a color filter.

Technical Solution

According to an embodiment, provided is a photosensitive resin composition for a color filter that includes (A) a squaraine dye including at least one selected from compounds represented by the following Chemical Formulae 1 and 2; (B) an alkali soluble resin; (C) a photopolymerizable monomer; (D) a photopolymerization initiator; and (E) a solvent.

[Chemical Formula 1]

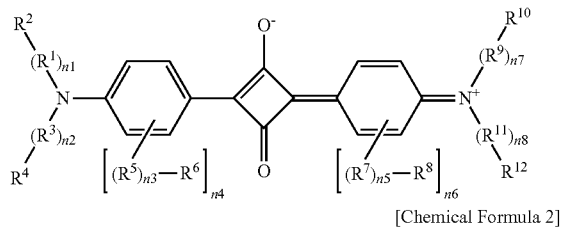

[Chemical Formula 2]

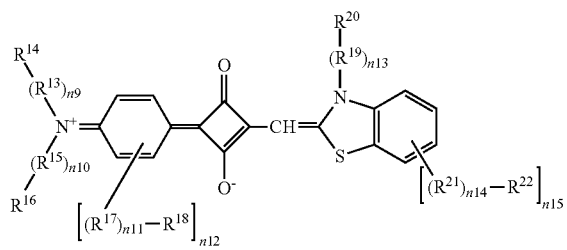

In Chemical Formulae 1 and 2, $R^1, R^3, R^5, R^7, R^9, R^{11}, R^{13}, R^{15}, R^{17}, R^{19}$, and $R^{21}$ are each independently a single bond, —O—, —NH—, —CO—, —COO—, a substituted or unsubstituted C1 to C20 alkylene group, a substituted or unsubstituted C2 to C20 alkenylene group, a substituted or unsubstituted C2 to C20 alkynylene group, a substituted or unsubstituted C1 to C20 alkoxylene group, a substituted or unsubstituted C3 to C20 cycloalkylene group, a substituted or unsubstituted C3 to C20 cycloalkenylene group, a substituted or unsubstituted C3 to C20 cycloalkynylene group, or a substituted or unsubstituted C6 to C30 arylene group, $R^2$, $R^4$, $R^6$, $R^8$, $R^{10}$, $R^{12}$, $R^{14}$, $R^{16}$, $R^{18}$, $R^{20}$, and $R^{22}$ are each independently hydrogen atom, a hydroxy group, a (meth)acrylate group, —O—COR (wherein R is hydrogen, or a substituted or unsubstituted C1 to C20 alkyl group), —NH—COR' (wherein R' is hydrogen, or a substituted or unsubstituted C1 to C20 alkyl group), —NH—CO—C=CRR' (wherein R and R' are each independently hydrogen, or a substituted or unsubstituted C1 to C20 alkyl group), a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, or a substituted or unsubstituted C6 to C30 aryl group, at least one of $R^2$, $R^4$, $R^6$, $R^8$, $R^{10}$, $R^{12}$, $R^{14}$, $R^{16}$, $R^{18}$, $R^{20}$, and $R^{22}$ is a (meth)acrylate group, —O—COR (wherein R is hydrogen, or a substituted or unsubstituted C1 to C20 alkyl group), —NH—COR' (wherein R' is hydrogen, or a substituted or unsubstituted C1 to C20 alkyl group), or —NH—CO—C=CRR' (wherein R and R' are each independently hydrogen, or a substituted or unsubstituted C1 to C20 alkyl group), $n^1$, $n^2$, $n^3$, $n^5$, $n^7$, $n^8$, $n^9$, $n^{10}$, $n^{11}$, $n^{13}$, and $n^{14}$ are each an integer ranging from 0 to 10, and $n^4$, $n^6$, $n^{12}$, and $n^{15}$ are each an integer ranging from 0 to 4.

The squaraine dye may include at least one selected from the compounds represented by the following Chemical Formulae 3 to 8.

[Chemical Formula 3]

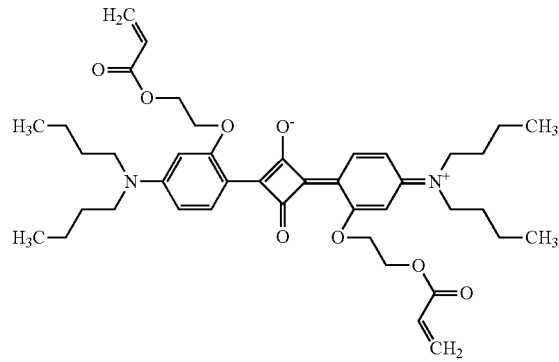

[Chemical Formula 4]

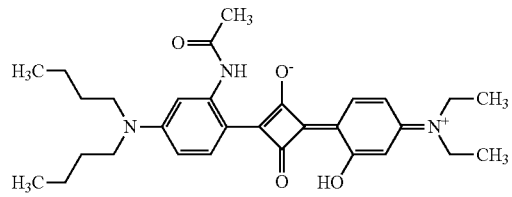

[Chemical Formula 5]

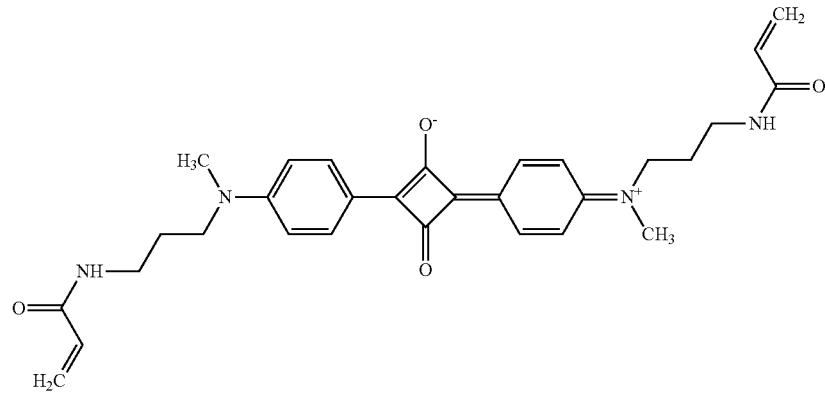

[Chemical Formula 6]

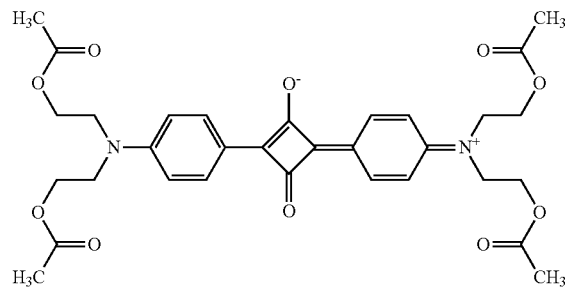

[Chemical Formula 7]

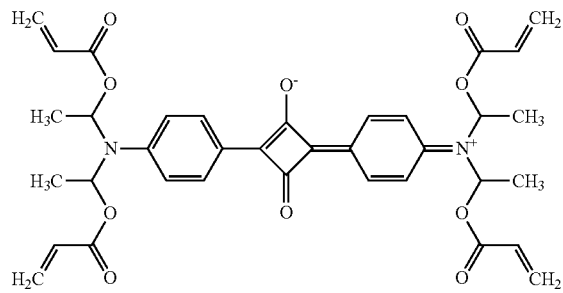

-continued

[Chemical Formula 8]

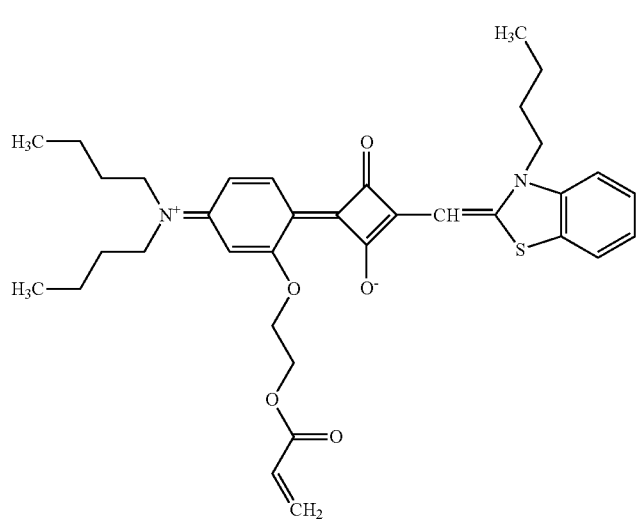

The squaraine dye may have a maximum absorption peak at a wavelength of 600 to 800 nm.

The photosensitive resin composition for a color filter may include (A) 0.5 to 10 wt % of the squaraine dye; (B) 0.1 to 30 wt % of the alkali soluble resin; (C) 0.1 to 30 wt % of the photopolymerizable monomer; (D) 0.1 to 5 wt % of the photopolymerization initiator; and (E) a balance amount of a solvent.

According to another embodiment, a color filter manufactured using the photosensitive resin composition for a color filter.

Advantageous Effects

A color filter having high luminance and contrast ratio may be realized.

BEST MODE

Exemplary embodiments will hereinafter be described in detail. However, these embodiments are only exemplary, and the present invention is not limited thereto.

As used herein, when specific definition is not otherwise provided, the term "substituted" refers to one substituted with at least a substituent selected from a halogen (F, Cl, Br, I), a hydroxy group, a C1 to C20 alkoxy group, a nitro group, a cyano group, an amino group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof, instead of hydrogen of a compound.

As used herein, when a definition is not otherwise provided, the term "heterocycloalkyl group", "heterocycloalkenyl group", "heterocycloalkynyl group", and "heterocycloalkylene group" may refer to a cyclic group of a cycloalkyl, cycloalkenyl, cycloalkynyl, and cycloalkylene including at least one hetero atom of N, O, S, or P.

As used herein, when a definition is not otherwise provided, the term "(meth)acrylate" may be "acrylate" and "methacrylate".

A photosensitive resin composition for a color filter according to one embodiment includes (A) squaraine dye, (B) an alkali soluble resin, (C) a photopolymerizable monomer, (D) a photopolymerization initiator, and (E) a solvent.

Hereinafter, each component of the photosensitive resin composition is described in detail.

(A) Squaraine Dye

The squaraine dye is a green dye, and includes at least one selected from compounds represented by the following Chemical Formulae 1 and 2.

[Chemical Formula 1]

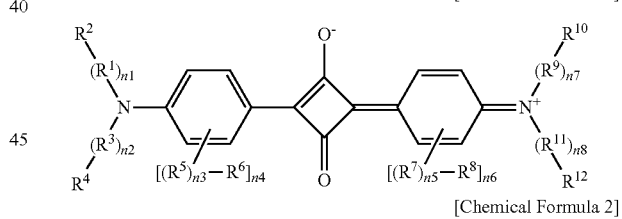

[Chemical Formula 2]

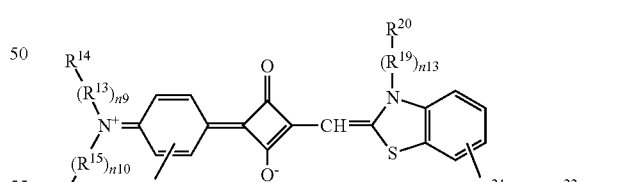

In Chemical Formulae 1 and 2, $R^1$, $R^3$, $R^5$, $R^7$, $R^9$, $R^{11}$, $R^{13}$, $R^{15}$, $R^{17}$, $R^{19}$, and $R^{21}$ are each independently a single bond, —O—, —NH—, —CO—, —COO—, a substituted or unsubstituted C1 to C20 alkylene group, a substituted or unsubstituted C2 to C20 alkenylene group, a substituted or unsubstituted C2 to C20 alkynylene group, a substituted or unsubstituted C1 to C20 alkoxylene group, a substituted or unsubstituted C3 to C20 cycloalkylene group, a substituted or unsubstituted C3 to C20 cycloalkenylene group, a substituted or unsubstituted C3 to C20 cycloalkynylene group, or a substituted or unsubstituted C6 to C30 arylene group. In one embodiment, $R^1$, $R^3$, $R^5$, $R^7$, $R^9$, $R^{11}$, $R^{13}$, $R^{15}$, $R^{17}$, $R^{19}$, and $R^{21}$ are independently a single bond, —O—, —NH—, —CO—, —COO—, a substituted or unsubstituted C1 to C20 alkylene group, or a substituted or unsubstituted C1 to C20 alkoxylene group.

In Chemical Formulae 1 and 2, $R^2$, $R^4$, $R^6$, $R^8$, $R^{10}$, $R^{12}$, $R^{14}$, $R^{16}$, $R^{18}$, $R^{20}$, and $R^{22}$ are each independently hydrogen atom, a hydroxy group, a (meth)acrylate group, —O—COR (wherein R is hydrogen, or a substituted or unsubstituted C1 to C20 alkyl group), —NH—COR' (wherein R' is hydrogen, or a substituted or unsubstituted C1 to C20 alkyl group), —NH—CO—C=CRR' (wherein R and R' are each independently hydrogen, or a substituted or unsubstituted C1 to C20 alkyl group), a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, or a substituted or unsubstituted C6 to C30 aryl group.

Herein, at least one of $R^2$, $R^4$, $R^6$, $R^8$, $R^{10}$, $R^{12}$, $R^{14}$, $R^{16}$, $R^{18}$, $R^{20}$, and $R^{22}$ is a (meth)acrylate group, —O—COR (wherein R is hydrogen, or a substituted or unsubstituted C1 to C20 alkyl group), —NH—COR' (wherein R' is hydrogen, or a substituted or unsubstituted C1 to C20 alkyl group), or —NH—CO—C=CRR' (wherein R and R' are each independently hydrogen, or a substituted or unsubstituted C1 to C20 alkyl group). In this way, at least one of $R^2$, $R^4$, $R^6$, $R^8$, $R^{10}$, $R^{12}$, $R^{14}$, $R^{16}$, $R^{18}$, $R^{20}$, and $R^{22}$ is a functional group such as a (meth)acrylate group, —O—COR, —NH—COR', and —NH—CO—C=CRR', which improves luminance and activates polymerization resulting in improvement of heat resistance, chemical resistance, and the like.

In Chemical Formulae 1 and 2, $n^1$, $n^2$, $n^3$, $n^5$, $n^7$, $n^8$, $n^9$, $n^{10}$, $n^{11}$, $n^{13}$, and $n^{14}$ are each an integer of 0 to 10, and $n^4$, $n^6$, $n^{12}$, and $n^{15}$ are each an integer of 0 to 4.

The squaraine dye may include at least one selected from the compounds represented by the following Chemical Formulae 3 to 8.

[Chemical Formula 3]

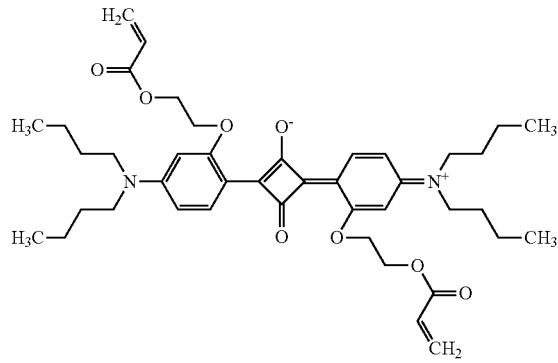

[Chemical Formula 4]

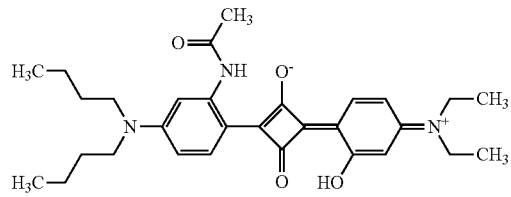

[Chemical Formula 5]

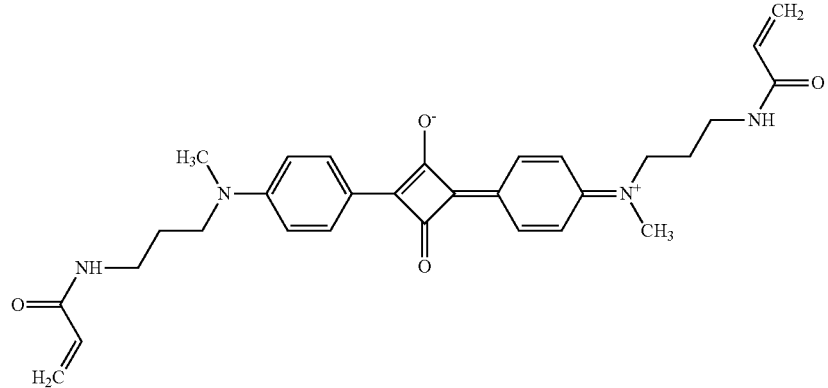

[Chemical Formula 6]

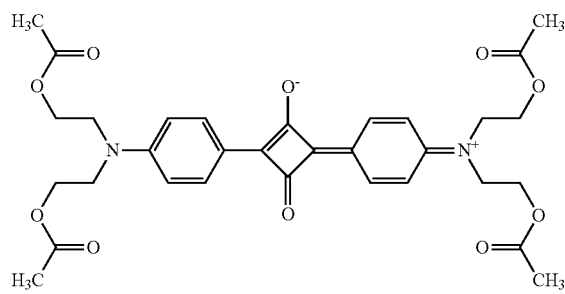

[Chemical Formula 7]

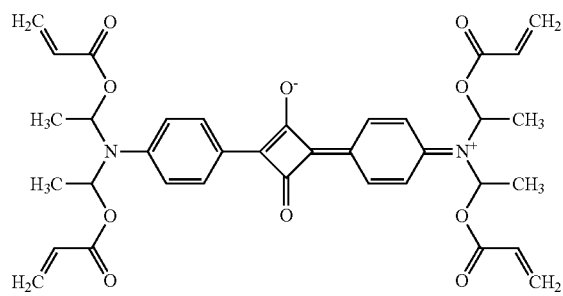

-continued

[Chemical Formula 8]

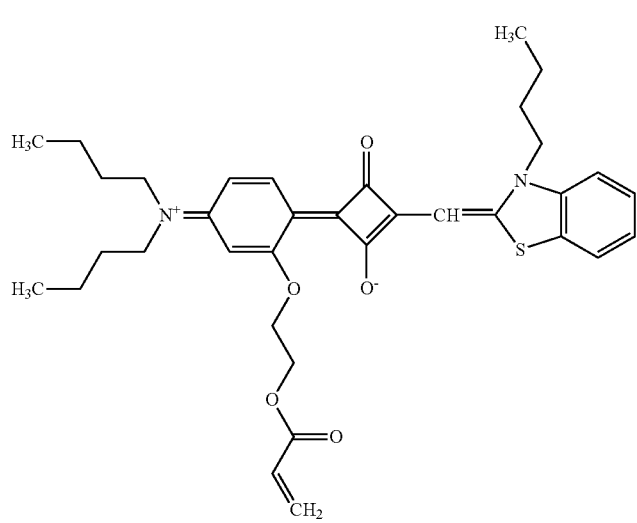

The squaraine dye as a green dye may be used singularly and as a mixture with an auxiliary dye.

The auxiliary dye may be a triarylmethane-based dye, an anthraquinone-based dye, a benzylidene-based dye, a cyanine-based dye, a phthalocyanine-based dye, an azaporphyrin-based dye, an indigo-based dye, a xanthene-based dye, and the like.

The squaraine dye may be used as a mixture with a pigment.

The pigment may be a red pigment, a green pigment, a blue pigment, a yellow pigment, a black pigment, and the like.

The red pigment may be C.I. red pigment 254, C.I. red pigment 255, C.I. red pigment 264, C.I. red pigment 270, C.I. red pigment 272, C.I. red pigment 177, C.I. red pigment 89, and the like. The green pigment may be C.I. green pigment 36, C.I. green pigment 7, C.I. green pigment 58, and the like. The blue pigment may be a copper phthalocyanine pigment such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. The yellow pigment may be an isoindoline-based pigment such as C.I. yellow pigment 139, and the like, a quinophthalone-based pigment such as C.I. yellow pigment 138, and the like, a nickel complex pigment such as C.I. yellow pigment 150, and the like. The black pigment may include aniline black, perylene black, titanium black, carbon black, and the like. The pigment may be used singularly or as a mixture of two or more, and is not limited to the above.

The pigment may be included in the photosensitive resin composition for a color filter, in a form of a dispersion. Such a pigment dispersion may include the pigment, a solvent, a dispersing agent, a binder resin, and the like.

The solvent may be ethylene glycol acetate, ethyl cellosolve, propylene glycol methyl ether acetate, ethyl lactate, polyethylene glycol, cyclohexanone, propylene glycol methyl ether, and the like, and in one embodiment, propylene glycol methyl ether acetate is preferable.

The dispersing agent helps the pigment in the dispersion uniformly, and may be a non-ionic, anionic or cationic dispersing agent. Examples of the dispersing agent may include polyalkylene glycol or esters thereof, polyoxy alkylene, a polyhydric alcohol ester alkylene oxide addition product, an alcohol alkylene oxide addition product, sulfonic acid ester, a sulfonate salt, carboxylic acid ester, a carboxylate salt, an alkyl amide alkylene oxide addition product, an alkyl amine, and the like. These may be used singularly or as a mixture of two or more.

The binder resin may be an acryl-based resin including a carboxyl group, and improves stability of the pigment dispersion and pixel patterning properties.

When the dye and the pigment are mixed, they may be mixed at a weight ratio of 1:9 to 9:1 and specifically at a weight ratio of 3:7 to 7:3. When mixed within the weight ratio range, the high luminance and contrast ratio may be realized while maintaining the color characteristics.

The squaraine dye may have a maximum absorption peak at a wavelength of 600 to 800 nm and specifically 650 to 750 nm. By using the squaraine dye having the spectrum characteristics, a photosensitive resin composition for a color filter may have the high luminance and the high contrast ratio.

The squaraine dye may have a solubility to the solvent (E) of greater than or equal to 5, and specifically 5 to 10. The solubility may determined by the amount (g) of the dye dissolved in 100 g of the solvent. When the dye has the solubility within the range, the coloring property and the compatibility to the following (B) alkali soluble resin, (C) photopolymerizable monomer, and (D) photopolymerization initiator may be ensured, and the precipitation of dye may be prevented.

The squaraine dye may have an excellent heat resistance. In other words, the thermal decomposition temperature may be greater than or equal to 200° C., and specifically 200 to 300° C. when measured by a thermogravimetric analyzer (TGA).

The squaraine dye may be included in an amount of 0.5 to 10 wt %, and specifically 0.5 to 5 wt % based on the total amount of the photosensitive resin composition for a color filter. When the squaraine dye is included within the range, the high luminance and contrast ratio may be realized in a desired color coordinate.

(B) Alkali Soluble Resin

The alkali soluble resin is a copolymer of an ethylenic unsaturated monomer including at least one carboxyl group and another ethylenic unsaturated monomer copolymerizable with the ethylenic unsaturated monomer, and a resin including at least one acryl-based repeating unit.

The first ethylenic unsaturated monomer is an ethylenic unsaturated monomer including at least one carboxyl group, and may include acrylic acid, methacrylic acid, maleic acid, itaconic acid, fumaric acid, or a combination thereof.

The first ethylenic unsaturated monomer may be included in an amount of 5 to 50 wt %, and specifically 10 to 40 wt %, based on the total weight of the alkali soluble resin.

The second ethylenic unsaturated monomer may include aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl (meth)acrylatem and the like; unsaturated carboxylic acid amino an alkyl ester compounds such as 2-aminoethyl(meth)acrylate, 2-dimethylaminoethyl(meth)acrylate, and the like; carbonic acid vinyl ester compounds such as vinyl acetate, vinyl benzoate, and the like; unsaturated carboxylic acid glycidyl ester compounds such as glycidyl(meth)acrylate; vinyl cyanide compounds such as (meth)acrylonitrile, and the like; unsaturated amide compounds such as (meth)acrylamide, and the like. These may be used singularly or as a mixture of two or more.

The alkali soluble resin may include a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzyl methacrylate/styrene/2-hydroxyethylmethacrylate copolymer, and the like, but is not limited thereto. These may be used singularly or as a combination of two or more.

The alkali soluble resin may have a weight average molecular weight of 3,000 to 150,000 g/mol, specifically 5,000 to 50,000 g/mol, and more specifically 20,000 to 30,000 g/mol. When the alkali soluble resin has a weight average molecular weight within the range, the photosensitive resin composition has improved physical and chemical properties and suitable viscosity resulting in improvement of close contacting properties with a substrate.

The alkali soluble resin may have an acid value of 15 to 60 mgKOH/g, and specifically 20 to 50 mgKOH/g. When the alkali soluble resin has an acid value within the above range, excellent pixel resolution may be obtained.

The alkali soluble resin may be included in an amount of 0.1 to 30 wt %, specifically 5 to 20 wt % based on the total amount of the photosensitive resin composition for a color filter. When the alkali soluble resin is included within the range, improved developability may be provided during manufacture of a color filter, and the cross-linking property is improved to obtain excellent smooth surface properties.

(C) Photopolymerizable Monomer

The photopolymerizable monomer may monofunctional or multi-functional ester of (meth)acrylic acid having at least one ethylenic unsaturated double bond.

The photopolymerizable monomer induce sufficient polymerization during exposure of a pattern forming process due to the ethylenic unsaturated double bond, and provides patterns having heat resistance, light resistance, and chemical resistance.

Specific examples of the photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenolA di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenolA epoxy(meth)acrylate, ethylene glycol monomethylether (meth)acrylate, trimethylol propane tri(meth)acrylate, tris(meth)acryloyloxyethyl phosphate, novolacepoxy (meth)acrylate, and the like.

The photopolymerizable monomer may be commercially available products as follows. Examples of monofunctinal ester of the (meth)acrylic acid may include Aronix M-101®, M-111®, M-114®, and the like (TOAGOSEI CHEMICAL INDUSTRY CO., LTD.); KAYARAD TC-110S®, TC-1205®, and the like (NIPPON KAYAKU CO., LTD.); V-158®, V-2311®, and the like (OSAKA ORGANIC CHEMICAL IND., LTD.), and the like. Examples of difunctinal ester of the (meth)acrylic acid may include Aronix M-210®, M-240®, M-6200®, and the like (TOAGOSEI CHEMICAL INDUSTRY CO., LTD.); KAYARAD HDDA®, HX-220®, R-604®, and the like (NIPPON KAYAKU CO., LTD.); V-260®, V-312®, V-335 HP®, and the like (OSAKA ORGANIC CHEMICAL IND., LTD.); and the like. Examples of a trifunctional (meth)acrylic acid ester may include Aronix M-309®, M-400®, M-405®, M-450®, M-7100®, M-8030®, M-8060®, and the like (TOAGOSEI CHEMICAL INDUSTRY CO., LTD.); KAYARAD TMPTA®, DPCA-20®, DPCA-30®, DPCA-60®, DPCA-120®, and the like (NIPPON KAYAKU CO., LTD.); V-295®, V-300®, V-360®, V-GPT®, V-3PA®, V-400®, and the like (Osaka Yuki Kayaku Kogyo Co. Ltd.); and the like. The commercially available products may be used singularly or as a mixture of two or more.

The photopolymerizable monomer may be treated with acid anhydride to improve development properties.

The photopolymerizable monomer may be included in an amount 0.1 to 30 wt %, and specifically 5 to 20 wt % based on the total amount of the photosensitive resin composition for a color filter. When the photopolymerizable monomer is included within the range, pattern characteristic and developability during fabrication of a color filter may be excellent.

(D) Photopolymerization Initiator

The photopolymerization initiator may be an acetophenone-based compound, a benzophenone-based compound, a thioxanthone-based compound, a benzoin-based compound, a triazine-based compound, an oxime-based compound, and the like.

The acetophenone-based compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

The benzophenone-based compound may include benzophenone, benzoyl benzoate, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

The thioxanthone-based compound may include thioxanthone, 2-methylthioxanthone, isopropyl thioxanthone, 2,4-diethyl thioxanthone, 2,4-Ɫ lisopropyl thioxanthone, 2-chlorothioxanthone, and the like.

The benzoin-based compound may include benzoin, benzoin methyl ether, benzoin ethyl ether, benzoin isopropyl ether, benzoin isobutyl ether, benzyldimethylketal, and the like.

The triazine-based compound may include 2,4,6-trichloro-s-triazine, 2-phenyl 4,6-bis(trichloromethyl)-s-triazine, 2-(3', 4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2-4-tri chloromethyl(piperonyl)-6-triazine, 2-4-trichloromethyl(4'-methoxystyryl)-6-triazine, and the like.

The oxime-based compound may include 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like.

The photopolymerization initiator may further include a carbazole-based compound, a diketone-based compound, a sulfonium borate-based compound, a diazo-based compound, an imidazole-based compound, a biimidazole-based compound, and the like, besides the above described compounds.

The photopolymerization initiator may be included in an amount of 0.1 to 5 wt %, and specifically 1 to 3 wt % based on the total amount of the photosensitive resin composition for a color filter. When the photopolymerization initiator is included within the range, the photopolymerization is sufficiently carried out by exposure during the patterning process for providing a color filter to provide the excellent sensitivity and to improve the transmittance.

(E) Solvent

The solvent is not specifically limited, and for example, alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbon such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate; ketonic acid esters such as ethyl pyruvate; and the like, and combinations thereof. Furthermore, the solvent may be N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or as a mixture.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like.

The solvent is used as a balance, and specifically 20 to 90 wt % based on the total amount of the photosensitive resin composition for a color filter. When the solvent is included within the above range, the photosensitive resin composition has excellent coating property and provides a flatness of a film having a thickness of greater than or equal to 3 μm.

(F) Other Additive

The photosensitive resin composition may further include additives such as malonic acid; 3-amino-1,2-propanediol; a silane-based coupling agent including a vinyl group or a (meth)acryloxy group; a leveling agent; a fluorine-based surfactant; a radical polymerization initiator, and the like to prevent stains, improve leveling performance, and also prevent the residues from being generated due to undevelopment.

The photosensitive resin composition for a color filter may further include an additive such as an epoxy compound in order to improve close contacting properties with a substrate.

The epoxy compound may include a phenol novolac epoxy compound, a tetramethyl biphenyl epoxy compound, a bisphenol A epoxy compound, an alicyclic epoxy compound, or a combination thereof.

The amount of the additive may be adjusted depending on desired properties.

According to another embodiment, a color filter manufactured using the photosensitive resin composition for a color filter is provided. The method for manufacturing the color filter is as follows.

The above-described photosensitive resin composition for a color filter is applied onto a glass substrate which is not coated with anything and onto a glass substrate coated with $SiN_x$, which is a protective layer, in a thickness of 500 to 1500 Å through a proper method, such as a spin coating process or a slit coating method to have a thickness of 3.1 to 3.4 μm. After the coating process, the glass substrate is irradiated with light to thereby form a pattern needed for the color filter. After the irradiation, the coating layer is treated with an alkali development solution. In this way, a part not irradiated with the light is dissolved to thereby form the pattern needed for the color filter. A color filter having a desired pattern may be acquired by repeatedly performing the process based on the number of R, G and B colors in need.

Also, in the process, crack resistance and solvent resistance may be further improved by heating an image pattern acquired from the development again or solidifying the image pattern through active ray radiation.

MODE FOR INVENTION

Hereinafter, this disclosure is illustrated in more detail with reference to examples. However, these are exemplary embodiments of this disclosure and are not limiting.

Preparation of Squaraine Dye

Preparation Example 1

398 mg of squaric acid and 2.23 g of 2-(3-(dibutylamino)phenoxy)ethyl acrylate were introduced into a 100 mL 3-neck flask and added with 40 mL of n-butanol and 20 mL of toluene and heated and refluxed at 120° C. for 5 hours. Using a Dean-Stark trap set, water generated during the reaction was removed to accelerate the reaction. After completing the reaction, it was cooled and extracted with methylene chloride and then performed with a column chromatography to provide a compound represented by the following Chemical Formula 3 at a yield of 60%.

[Chemical Formula 3]

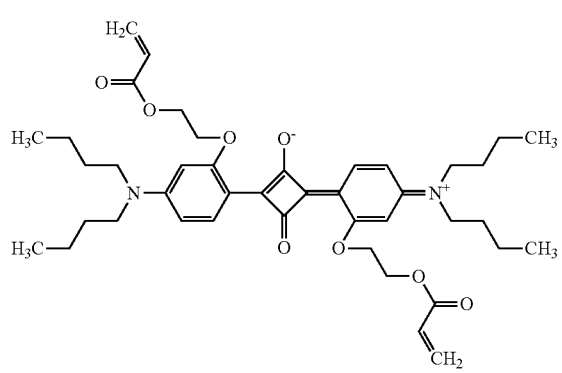

Preparation Example 2

A compound represented by the following Chemical Formula 4 was synthesized in accordance with the same procedure as in Preparation Example 1, except N-(3-dibutylamino)phenyl)acetamide and 3-(diethylamino)phenol were used instead of 2-(3-dibutylamino)phenoxy)ethyl acrylate.

[Chemical Formula 4]

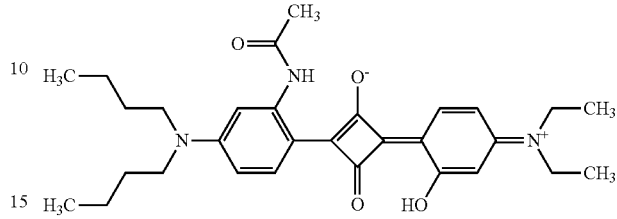

Preparation Example 3

A compound represented by the following Chemical Formula 5 was synthesized in accordance with the same procedure as in Preparation Example 1, except 2-(3-(methyl(phenyl)amino)propylamino)ethyl acrylate was used instead of 2-(3-dibutylamino)phenoxy)ethyl acrylate.

[Chemical Formula 5]

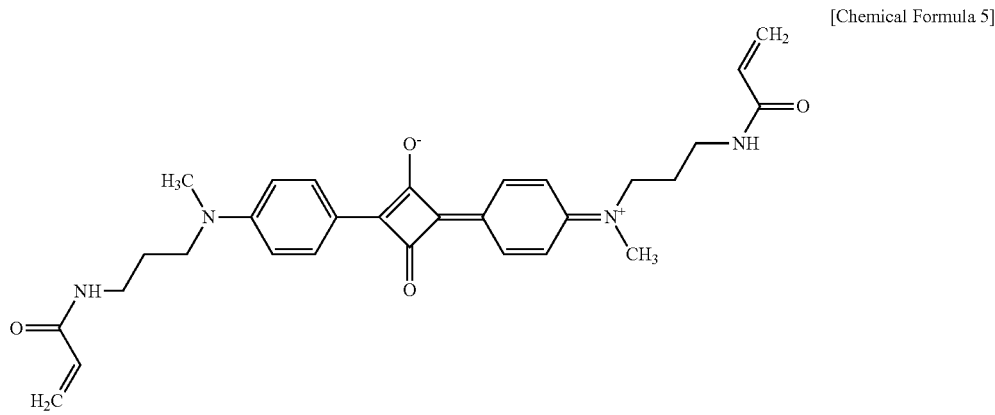 [SMILES: C=CC(=O)NCCCN(C)c1ccc(C2=C([O-])C(=C3C=CC(=[N+](C)CCCNC(=O)C=C)C=C3)C2=O)cc1]

Preparation Example 4

A compound represented by the following Chemical Formula 6 was synthesized in accordance with the same procedure as in Preparation Example 1, except 2,2'-(phenylazanediyl)-bis-(ethan-2,1-diyl)diacetate was used instead of 2-(3-dibutylamino)phenoxy)ethyl acrylate.

[Chemical Formula 6]

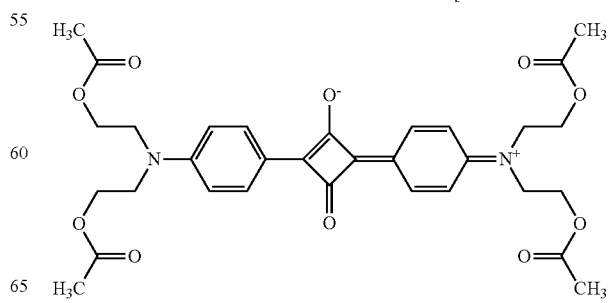

Preparation Example 5

A compound represented by the following Chemical Formula 7 was synthesized in accordance with the same procedure as in Preparation Example 1, except 1,1'-(phenylazanediyl)-bis-(ethan-1,1-diyl)diacetate was used instead of 2-(3-dibutylamino)phenoxy)ethyl acrylate.

[Chemical Formula 7]

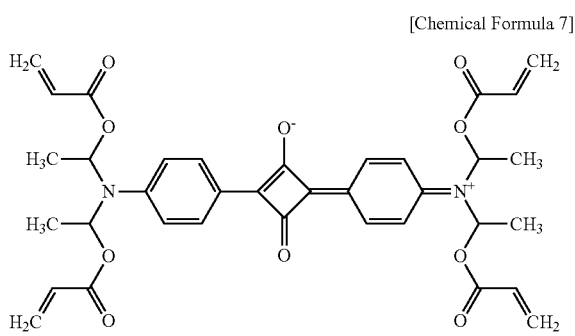 [SMILES: C=CC(=O)OC(C)N(c1ccc(C2=C([O-])C(=C3C=CC(=[N+](C(C)OC(=O)C=C)C(C)OC(=O)C=C)C=C3)C2=O)cc1)C(C)OC(=O)C=C]

Preparation Example 6

A compound represented by the following Chemical Formula 8 was synthesized in accordance with the same procedure as in Preparation Example 1, except 3-butyl-2-methyl-benzothiazol-3-ium was used instead of 2-(3-dibutylamino)phenoxy)ethyl acrylate.

[Chemical Formula 8]

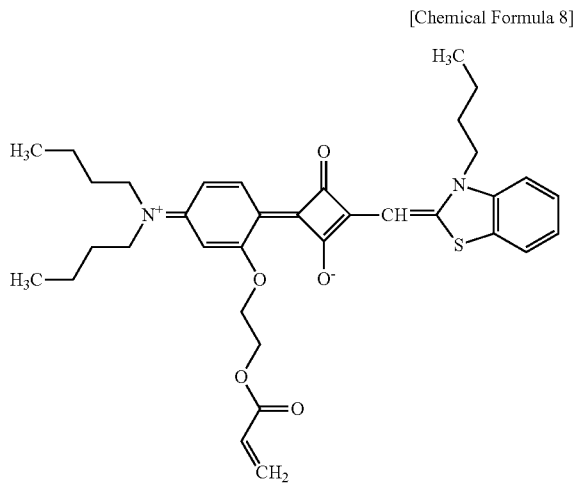 [SMILES: C=CC(=O)OCCOC1=CC(=[N+](CCCC)CCCC)C=C/C1=C1\C(=O)C(C=C2Sc3ccccc3N2CCCC)=C1[O-]]

Preparation of Photosensitive Resin Composition for Color Filter

Each component used in preparation of photosensitive resin composition for a color filter is as follows.

(A) Squaraine Dye

Each compound used in Preparation Examples 1 to 6 was used.

(A') Pigment Dispersion (A'-1) C.I. green pigment 58 was used.

(A'-2) C.I. green pigment 36 was used.

(B) Alkali Soluble Resin

A methacrylic acid/benzylmethacrylate copolymer (mixed weight ratio 15/85) having a weight average molecular weight of 22,000 g/mol was used.

(C) Photopolymerizable Monomer

Dipentaerythritolhexaacrylate was used.

(D) Photopolymerization Initiator (D-1) 1,2-octandione was used.

(D-2) 2-dimethylamino-2-(4-methyl-benzyl)-1-(4-morpholin-4-yl-phenyl)-butan-1-one was used.

(E) Solvent (E-1) Cyclohexanone was used.

(E-2) Propyleneglycol methyletheracetate was used.

Examples 1 to 6 and Comparative Examples 1 and 2

Each component was mixed in a composition shown in the following Table 1 to provide a photosensitive resin composition for a color filter. For example, a photopolymerization initiator was dissolved in a solvent and agitated at a room temperature for 2 hours; added with a dye and agitated for 30 minutes; and added with an alkali soluble resin and a photopolymerizable monomer and agitated at a room temperature for 2 hours. The solution was filtered for three times, and the impurity was removed to provide a photosensitive resin composition for a color filter.

TABLE 1

(unit: wt %)

|  |  | Example | | | | | | Comparative Example | |
|---|---|---|---|---|---|---|---|---|---|
|  |  | 1 | 2 | 3 | 4 | 5 | 6 | 1 | 2 |
| (A) squaraine dye | Preparation Example 1 | 2 | — | — | — | — | — | — | — |
|  | Preparation Example 2 | — | 2 | — | — | — | — | — | — |
|  | Preparation Example 3 | — | — | 2 | — | — | — | — | — |
|  | Preparation Example 4 | — | — | — | 2 | — | — | — | — |
|  | Preparation Example 5 | — | — | — | — | 2 | — | — | — |
|  | Preparation Example 6 | — | — | — | — | — | 2 | — | — |

TABLE 1-continued (unit: wt %)

|  |  | Example | | | | | | Comparative Example | |
|---|---|---|---|---|---|---|---|---|---|
|  |  | 1 | 2 | 3 | 4 | 5 | 6 | 1 | 2 |
| (A') Pigment dispersion | A'-1 | — | — | — | — | — | — | 35 | — |
|  | A'-2 | — | — | — | — | — | — | — | 35 |
| (B) Alkali soluble resin |  | 3.5 | 3.5 | 3.5 | 3.5 | 3.5 | 3.5 | 2.5 | 2.5 |
| (C) Photopolymerizable monomer |  | 8 | 8 | 8 | 8 | 8 | 8 | 5 | 5 |
| (D) Photopolymerization initiator | D-1 | 1 | 1 | 1 | 1 | 1 | 1 | 1 | 1 |
|  | D-2 | 0.5 | 0.5 | 0.5 | 0.5 | 0.5 | 0.5 | 0.5 | 0.5 |
| (E) Solvent | E-1 | 40 | 40 | 40 | 40 | 40 | 40 | 40 | 40 |
|  | E-2 | 45 | 45 | 45 | 45 | 45 | 45 | 16 | 16 |

Evaluation 1: Luminance

Each photosensitive resin composition for a color filter obtained from Examples 1 to 6 and Comparative Examples 1 and 2 was coated on a 1 mm-thick degreased glass substrate in a thickness of 1 to 3 μm and dried on a hot plate at 90° C. for 2 minutes to provide a coating layer. The coating layer was exposed by a high-pressure mercury lamp having a main wavelength of 365 nm. It was dried in a hot air circulation furnace at 200° C. for 5 minutes. A pixel layer was measured for a color coordinate (x, y) and a luminance (Y) by a spectrophotometer (MCPD3000, measured by Otsuka electronic), and the results are shown in the following Table 2.

TABLE 2

|  | Color coordinate | | Luminance |
|---|---|---|---|
|  | x | y | Y |
| Example 1 | 0.284 | 0.575 | 66.4 |
| Example 2 | 0.291 | 0.560 | 67.3 |
| Example 3 | 0.294 | 0.583 | 66.1 |
| Example 4 | 0.300 | 0.574 | 66.9 |
| Example 5 | 0.313 | 0.555 | 67.7 |
| Example 6 | 0.297 | 0.564 | 68.1 |
| Comparative Example 1 | 0.271 | 0.565 | 63.3 |
| Comparative Example 2 | 0.285 | 0.557 | 65.2 |

As shown in Table 2, the photosensitive resin compositions obtained from Examples 1 to 6 using the squaraine dye had the higher luminance than those of Comparative Examples 1 and 2 using a pigment instead of the squaraine dye.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. The aforementioned embodiments are exemplary but are not limiting in any way.

The invention claimed is:

1. A photosensitive resin composition for a color filter, comprising:

(A) a squaraine dye including at least one selected from compounds represented by the following Chemical Formulae 1 and 2;
(B) an alkali soluble resin;
(C) a photopolymerizable monomer;
(D) a photopolymerization initiator; and
(E) a solvent:

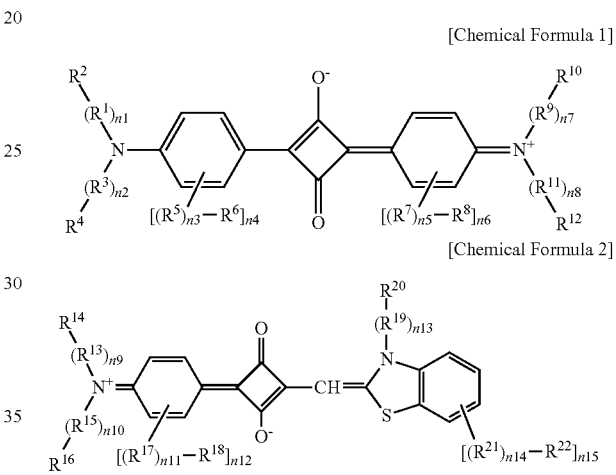

[Chemical Formula 1]

[Chemical Formula 2]

wherein, in Chemical Formulae 1 and 2, $R^1, R^3, R^5, R^7, R^9, R^{11}, R^{13}, R^{15}, R^{17}, R^{19}$, and $R^{21}$ are each independently a single bond, —O—, —NH—, —CO—, —COO—, a substituted or unsubstituted C1 to C20 alkylene group, a substituted or unsubstituted C2 to C20 alkenylene group, a substituted or unsubstituted C2 to C20 alkynylene group, a substituted or unsubstituted C1 to C20 alkoxylene group, a substituted or unsubstituted C3 to C20 cycloalkylene group, a substituted or unsubstituted C3 to C20 cycloalkenylene group, a substituted or unsubstituted C3 to C20 cycloalkynylene group, or a substituted or unsubstituted C6 to C30 arylene group, $R^2$, $R^4$, $R^{10}$, and $R^{12}$ are each independently hydrogen atom, a hydroxy group, a (meth)acrylate group, —O—COR wherein R of —O—COR is hydrogen or a substituted or unsubstituted C1 to C20 alkyl group, —NH—CO—C=CRR' wherein R and R' of —NH—CO—C=CRR' are each independently hydrogen or a substituted or unsubstituted C1 to C20 alkyl group, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, or a substituted or unsubstituted C6 to C30 aryl group, R⁶ and R⁸ are each independently hydrogen atom, a hydroxy group, a (meth)acrylate group, —NH—CO—C=CRR' wherein R and R' of —NH—CO—C=CRR' are each independently hydrogen or a substituted or unsubstituted C1 to C20 alkyl group, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, or a substituted or unsubstituted C6 to C30 aryl group, wherein at least one of $R^2$, $R^4$, $R^{10}$, and $R^{12}$ is a (meth)acrylate group, —O—COR wherein R of —O—COR is hydrogen or a substituted or unsubstituted C1 to C20 alkyl group, or —NH—CO—C=CRR' wherein R and R' of —NH—CO—C=CRR' are each independently hydrogen or a substituted or unsubstituted C1 to C20 alkyl group, and/or at least one of $R^6$ and $R^8$ is a (meth)acrylate group or —NH—CO—C=CRR' wherein R and R' of —NH—CO—C=CRR' are each independently hydrogen or a substituted or unsubstituted C1 to C20 alkyl group, $R^{14}$, $R^{16}$, $R^{18}$, $R^{20}$, and $R^{22}$ are each independently hydrogen atom, a hydroxy group, a (meth)acrylate group, —O—COR wherein R of —O—COR is hydrogen or a substituted or unsubstituted C1 to C20 alkyl group, —NH—COR' wherein R' of —NH—COR' is hydrogen or a substituted or unsubstituted C1 to C20 alkyl group, —NH—CO—C=CRR' wherein R and R' of —NH—CO—C=CRR' are each independently hydrogen or a substituted or unsubstituted C1 to C20 alkyl group, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, or a substituted or unsubstituted C6 to C30 aryl group, at least one of $R^{14}$, $R^{16}$, $R^{18}$, $R^{20}$, and $R^{22}$ is a (meth)acrylate group, —O—COR wherein R of —O—COR is hydrogen or a substituted or unsubstituted C1 to C20 alkyl group, —NH—COR' wherein R' of NH—COR' is hydrogen or a substituted or unsubstituted C1 to C20 alkyl group, or —NH—CO—C=CRR' wherein R and R' of —NH—CO—C=CRR' are each independently hydrogen or a substituted or unsubstituted C1 to C20 alkyl group, $n^1$, $n^2$, $n^3$, $n^5$, $n^7$, $n^8$, $n^9$, $n^{10}$, $n^{11}$, $n^{13}$, and $n^{14}$ are each an integer ranging from 0 to 10, and $n^4$, $n^6$, $n^{12}$, and $n^{15}$ are each an integer ranging from 0 to 4.

2. The photosensitive resin composition for a color filter of claim 1, wherein the squaraine dye comprises at least one selected from the compounds represented by the following Chemical Formulae 3, and 5 to 8:

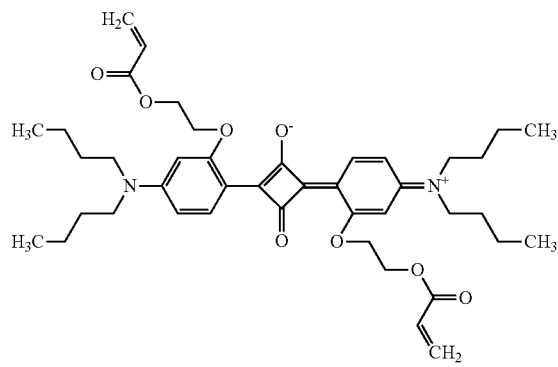

[Chemical Formula 3]

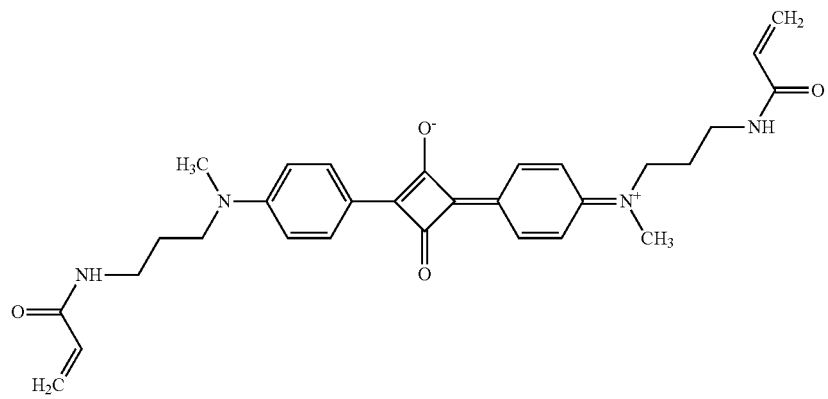

[Chemical Formula 5]

-continued

[Chemical Formula 6]

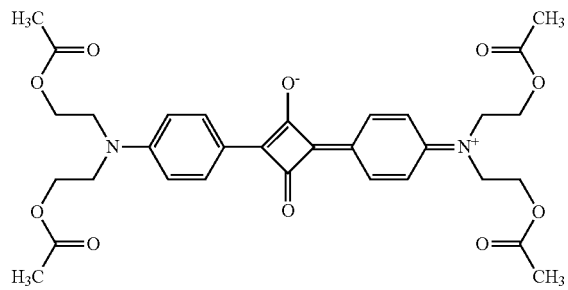

[Chemical Formula 7]

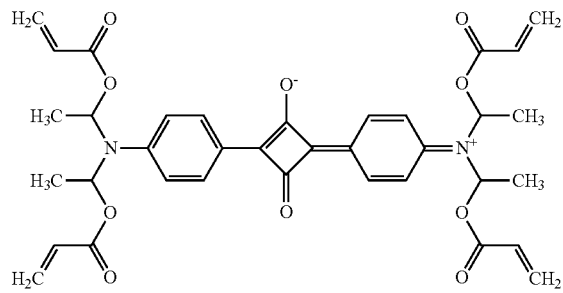

[Chemical Formula 8]

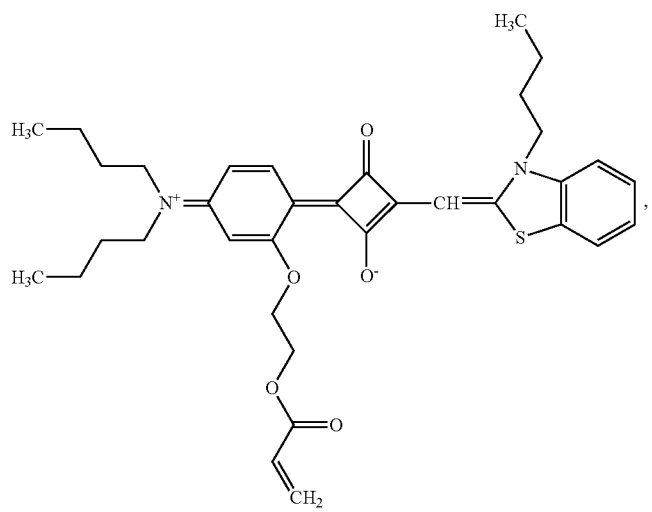

3. The photosensitive resin composition for a color filter of claim 1, wherein the squaraine dye has a maximum absorption peak at a wavelength of 600 to 800 nm.

4. The photosensitive resin composition for a color filter of claim 1, wherein the photosensitive resin composition for a color filter comprises:

(A) 0.5 to 10 wt % of the squaraine dye;
(B) 0.1 to 30 wt % of the alkali soluble resin;
(C) 0.1 to 30 wt % of the photopolymerizable monomer;
(D) 0.1 to 5 wt % of the photopolymerization initiator; and
(E) a balance amount of a solvent.

5. A color filter manufactured using the photosensitive resin composition for a color filter according to claim 1.

* * * * *